United States Patent
Chattopadhyay et al.

(10) Patent No.: US 8,173,537 B1
(45) Date of Patent: *May 8, 2012

(54) METHODS FOR REDUCING UV AND DIELECTRIC DIFFUSION BARRIER INTERACTION

(75) Inventors: Kaushik Chattopadhyay, San Jose, CA (US); Keith Fox, Portland, OR (US); Tom Mountsier, San Jose, CA (US); Hui-Jung Wu, Fremont, CA (US); Bart van Schravendijk, Sunnyvale, CA (US); Kimberly Branshaw, Santa Clara, CA (US)

(73) Assignee: Novellus Systems, Inc., San Jose, CA (US)

( * ) Notice: Subject to any disclaimer, the term of this patent is extended or adjusted under 35 U.S.C. 154(b) by 908 days.

This patent is subject to a terminal disclaimer.

(21) Appl. No.: 11/693,617

(22) Filed: Mar. 29, 2007

(51) Int. Cl.
*H01L 21/768* (2006.01)
*H01L 23/532* (2006.01)

(52) U.S. Cl. ........ 438/618; 438/378; 438/687; 438/795; 438/796; 438/797

(58) Field of Classification Search .......... None
See application file for complete search history.

(56) References Cited

U.S. PATENT DOCUMENTS

| | | | |
|---|---|---|---|
| 4,177,474 A | 12/1979 | Ovshinsky | |
| 4,656,110 A | 4/1987 | Yamazaki | |
| 5,034,355 A | 7/1991 | Tani et al. | |
| 5,108,965 A | 4/1992 | Tani et al. | |
| 5,324,690 A | 6/1994 | Gelatos et al. | |
| 5,464,699 A | 11/1995 | Baldi | |
| 5,654,208 A | 8/1997 | Harris et al. | |
| 5,739,579 A | 4/1998 | Chiang et al. | |
| 5,958,324 A | 9/1999 | Bujalski et al. | |
| 6,045,877 A | 4/2000 | Gleason et al. | |
| 6,100,587 A | 8/2000 | Merchant et al. | |
| 6,150,719 A | 11/2000 | Saia et al. | |
| 6,159,871 A | 12/2000 | Loboda et al. | |
| 6,197,688 B1 | 3/2001 | Simpson | |
| 6,242,686 B1 | 6/2001 | Kishimoto et al. | |
| 6,352,945 B1 | 3/2002 | Matsuki | |
| 6,383,898 B1 | 5/2002 | Kishimoto et al. | |
| 6,383,955 B1 | 5/2002 | Matsuki | |
| 6,399,484 B1 | 6/2002 | Yamasaki et al. | |
| 6,410,419 B1 | 6/2002 | Merchant et al. | |
| 6,417,092 B1 | 7/2002 | Jain et al. | |
| 6,424,044 B1 | 7/2002 | Han et al. | |
| 6,432,846 B1 | 8/2002 | Matsuki | |

(Continued)

OTHER PUBLICATIONS

Masahiko Maeda et al., "A Low-Permittivity Interconnection Using an SiBN Interlayer", Sep. 1989, IEEE Transactions on Electron Devices, vol. 36, No. 9.

(Continued)

*Primary Examiner* — Zandra Smith
*Assistant Examiner* — Pamela E Perkins
(74) *Attorney, Agent, or Firm* — Weaver Austin Villeneuve & Sampson LLP

(57) ABSTRACT

Stability of an underlying dielectric diffusion barrier during deposition and ultraviolet (UV) processing of an overlying dielectric layer is critical for successful integration. UV-resistant diffusion barrier layers are formed by depositing the layer in a hydrogen-starved environment. Diffusion barrier layers can be made more resistant to UV radiation by thermal, plasma, or UV treatment during or after deposition. Lowering the modulus of the diffusion barrier layer can also improve the resistance to UV radiation.

21 Claims, 5 Drawing Sheets

U.S. PATENT DOCUMENTS

| | | | |
|---|---|---|---|
| 6,455,409 B1 | 9/2002 | Subramanian et al. | |
| 6,465,372 B1 | 10/2002 | Xia et al. | |
| 6,506,692 B2 | 1/2003 | Andideh | |
| 6,670,715 B2 | 12/2003 | Yang et al. | |
| 6,764,958 B1 | 7/2004 | Nemani et al. | |
| 6,774,489 B2 | 8/2004 | Russell et al. | |
| 6,790,767 B2 | 9/2004 | Lee | |
| 6,790,788 B2 | 9/2004 | Li et al. | |
| 6,855,645 B2 | 2/2005 | Tang et al. | |
| 6,881,683 B2 | 4/2005 | Matsuki et al. | |
| 6,890,850 B2 | 5/2005 | Lee et al. | |
| 6,930,013 B2 * | 8/2005 | Choi et al. | 438/396 |
| 6,967,405 B1 | 11/2005 | Yu et al. | |
| 7,064,088 B2 | 6/2006 | Hyodo et al. | |
| 7,091,137 B2 | 8/2006 | Lee et al. | |
| 7,115,534 B2 | 10/2006 | Nguyen et al. | |
| 7,163,889 B2 | 1/2007 | Yu et al. | |
| 7,239,017 B1 | 7/2007 | Yu et al. | |
| 7,253,125 B1 | 8/2007 | Bandyopadhyay et al. | |
| 7,282,438 B1 | 10/2007 | Yu et al. | |
| 7,381,662 B1 | 6/2008 | Niu et al. | |
| 7,420,275 B1 | 9/2008 | Yu et al. | |
| 7,468,290 B2 | 12/2008 | Lukas et al. | |
| 7,573,061 B1 | 8/2009 | Yu et al. | |
| 7,842,604 B1 | 11/2010 | Yu et al. | |
| 7,915,166 B1 | 3/2011 | Yu et al. | |
| 7,923,385 B2 | 4/2011 | Wu et al. | |
| 7,968,436 B1 | 6/2011 | Yu et al. | |
| 2001/0021491 A1 | 9/2001 | Chen et al. | |
| 2002/0019148 A1 | 2/2002 | Hawryluk et al. | |
| 2003/0001275 A1 | 1/2003 | Sambucetti et al. | |
| 2003/0049460 A1 | 3/2003 | O'Neil et al. | |
| 2003/0057553 A1 | 3/2003 | DelaRosa et al. | |
| 2003/0068881 A1 | 4/2003 | Xia et al. | |
| 2003/0082296 A1 | 5/2003 | Elers et al. | |
| 2003/0089992 A1 | 5/2003 | Rathi et al. | |
| 2003/0162033 A1 * | 8/2003 | Johnson et al. | 428/426 |
| 2003/0194496 A1 | 10/2003 | Xu et al. | |
| 2003/0232150 A1 * | 12/2003 | Arnold et al. | 427/569 |
| 2003/0232514 A1 | 12/2003 | Kim et al. | |
| 2004/0067308 A1 | 4/2004 | Zheng et al. | |
| 2004/0084774 A1 | 5/2004 | Li et al. | |
| 2004/0113279 A1 | 6/2004 | Chen et al. | |
| 2004/0124531 A1 | 7/2004 | Venkatraman et al. | |
| 2004/0207084 A1 | 10/2004 | Hedrick et al. | |
| 2005/0014361 A1 | 1/2005 | Nguyen et al. | |
| 2005/0042889 A1 | 2/2005 | Lee et al. | |
| 2005/0202685 A1 | 9/2005 | Huang et al. | |
| 2005/0233555 A1 | 10/2005 | Rajagopalan et al. | |
| 2005/0236711 A1 | 10/2005 | Wang et al. | |
| 2005/0245071 A1 | 11/2005 | Wu et al. | |
| 2005/0277302 A1 | 12/2005 | Nguyen et al. | |
| 2006/0019486 A1 | 1/2006 | Yu et al. | |
| 2006/0110931 A1 | 5/2006 | Fukazawa et al. | |
| 2007/0166546 A1 | 7/2007 | Ichikawa et al. | |
| 2008/0063809 A1 * | 3/2008 | Lee et al. | 427/558 |
| 2008/0070396 A1 | 3/2008 | Budrevich et al. | |
| 2008/0122103 A1 * | 5/2008 | Bonilla et al. | 257/767 |
| 2008/0128907 A1 | 6/2008 | Yang et al. | |
| 2008/0173984 A1 | 7/2008 | Lin et al. | |
| 2008/0254641 A1 | 10/2008 | Kobayashi et al. | |
| 2009/0215282 A1 | 8/2009 | Moore et al. | |
| 2011/0111590 A1 | 5/2011 | Edelstein et al. | |
| 2011/0135557 A1 | 6/2011 | Rangarajan et al. | |

OTHER PUBLICATIONS

Takashi Sugino et al., "Synthesis of boron nitride film with low dielectric constant for its application to silicon ultralarge scale integrated semiconductors", 2001 Elsevier Science B.V., Diamond and Related Materials 1275-1379.

Yu et al., "Low-K B-Doped SiC Copper Diffusion Barrier Films", Novellus Systems, Inc. U.S. Appl. No. 10/915,117, filed Aug. 9, 2004, pp. 1-22.

U.S. Office Action mailed Feb. 24, 2005, from U.S. Appl. No. 10/670,660.

U.S. Office Action mailed May 3, 2006, from U.S. Appl. No. 10/915,117.

Yu et al., "Low-K Sic Copper Diffusion Barrier Films", Novellus Systems, Inc., U.S. Appl. No. 10/869,474, filed Jun. 15, 2004, pp. 1-25.

Yu et al., "Boron-Doped SiC Copper Diffusion Barrier Films", Novellus Systems, Inc., U.S. Appl. No. 11/373,847, filed Mar. 8, 2006, pp. 1-22.

U.S. Office Action mailed Sep. 6, 2006, from U.S. Appl. No. 10/869,474.

U.S. Office Action mailed Sep. 7, 2006, from U.S. Appl. No. 10/915,117.

U.S. Office Action mailed Dec. 11, 2006, from U.S. Appl. No. 10/915,117.

U.S. Office Action mailed Feb. 9, 2007, from U.S. Appl. No. 10/869,474.

Qingguo (Gordon) Wu et al., "Ultra Low k Dielectrics Prepared by PECVD Using a Single-Precursor and Treated by UV Assisted Thermal Processing", Oct. 17-19, 2006, Advanced Metallization Conference (AMC) 2006, San Diego, CA, pp. 1-6.

Wu et al. (Mar. 29, 2007), Methods for Improving Performance of ODC Films With Dielectric Constant.

Yu et al. (Feb. 22, 2007), "Improved Diffusion Barrier and Etch Stop Films," U.S. Appl. No. 11/710,652.

US Final Office Action (Sep. 7, 2006) from U.S. Appl. No. 10/915,117.

US Office Action (Sep. 6, 2006) from U.S. Appl. No. 10/869,474.

US Final Office Action (Jun. 28, 2007) from U.S. Appl. No. 10/869,474.

US Notice of Allowance (Jul. 26, 2007) from U.S. Appl. No. 10/869,474.

U.S. Office Action mailed May 1, 2008, U.S. Appl. No. 11/373,847.

U.S. Office Action mailed Dec. 31, 2008, U.S. Appl. No. 11/693,617.

U.S. Office Action mailed Apr. 10, 2009, U.S. Appl. No. 11/805,356.

Notice of Allowance for U.S. Appl. No. 11/893,490 mailed May 4, 2009.

Allowed Claims for U.S. Appl. No. 11/893,490.

U.S. Office Action mailed Aug. 28, 2009, U.S. Appl. No. 11/693,661.

U.S. Office Action mailed Oct. 7, 2009, U.S. Appl. No. 11/693,617.

U.S. Final Office Action mailed Oct. 13, 2009, U.S. Appl. No. 11/805,356.

U.S. Office Action mailed Nov. 20, 2009, U.S. Appl. No. 11/710,652.

U.S. Office Action mailed Feb. 24, 2010, U.S. Appl. No. 11/693,661.

U.S. Office Action mailed Apr. 8, 2010, U.S. Appl. No. 11/805,356.

U.S. Final Office Action mailed Apr. 15, 2010, U.S. Appl. No. 11/710,652.

Notice of Allowance and Allowed Claims for U.S. Appl. No. 11/805,356 mailed Jul. 26, 2010.

U.S. Office Action mailed Aug. 5, 2010, U.S. Appl. No. 11/710,652.

U.S. Office Action mailed Oct. 15, 2010 for U.S. Appl. No. 12/497,322.

U.S. Final Office Action for U.S. Appl. No. 11/693,661 mailed Nov. 5, 2010.

Notice of Allowance and Allowed Claims for U.S. Appl. No. 11/710,652, mailed Nov. 24, 2010.

U.S. Office Action mailed Jan. 12, 2011 for U.S. Appl. No. 11/693,617.

U.S. Notice of Allowance mailed Mar. 11, 2011 for U.S. Appl. No. 12/497,322.

Allowed Claims as of Mar. 11, 2011 for U.S. Appl. No. 12/497,322.

U.S. Final Office Action mailed Aug. 4, 2011 for U.S. Appl. No. 12/082,496.

* cited by examiner

METHODS FOR REDUCING UV AND DIELECTRIC DIFFUSION BARRIER INTERACTION

FIELD OF THE INVENTION

This invention relates to methods for reducing UV and dielectric diffusion barrier interaction. The invention also relates to methods of forming dielectric diffusion barrier layers suitable for integration in a wide range of VLSI and ULSI fabrication operations.

BACKGROUND OF THE INVENTION

There is a general need for materials with low dielectric constants (low-k) in the integrated circuit manufacturing industry. Using low-k materials as the interlayer dielectric (ILD) of conductive interconnects reduces the delay in signal propagation and signal crosstalk due to capacitive effects. The lower the dielectric constant of the dielectric, the lower the capacitance of the dielectric and the RC delay in the lines and signal crosstalk between electrical lines of the integrated circuit (IC). Further, the use of a low-k material as an interlayer dielectric reduces the power consumption of complex integrated circuits.

Low dielectric constant (k) ("low-k"), insulators, with k significantly lower than that of $SiO_2$ (3.9), are now used as inter-layer dielectric, e.g., as inter-metal dielectric (IMD) for reducing capacitive coupling and improving switching performance of integrated circuits (IC). For example, porous carbon doped silicon dioxide or fluorine doped silicon dioxide provide a dielectric constant of less than about 3.0.

Cu/IMD integration schemes typically involve the incorporation of other materials along with the bulk inter-metal dielectric material, forming a stack. These other materials may include copper diffusion barrier, copper capping layer and etch stop materials needed to prevent copper poisoning of the bulk low-k dielectric, to protect the relatively soft low-k dielectric, and to facilitate the damascene processing used in the device fabrication. These materials have a substantial impact on the effective k of the IMD stack. For example, an etch stop layer having a higher dielectric constant than the insulating IMD material proximate to it increases the overall effective k of the IMD stack. Thus, materials used for etch stop, barrier and capping layers must meet the dual challenges of minimizing the effective k of the stack while providing material selectivity and protection for the IMD layers.

Barrier and etch stop layers, should not only possess a low dielectric constant, but should preferably meet a number of integration requirements. These requirements relate to stability of these layers, their mechanical strength, their stress characteristics and their electrical performance. To meet integration requirements, the chemical, mechanical and electrical characteristics of the barrier and etch stop layers must stay within a certain range. These properties should remain stable while the layers are exposed to ambient conditions after deposition, during subsequent processing, and also during working conditions as part of an IC device. For mechanical strength, integration requires these layers to have high modulus and hardness values, which is correlated to etch selectivity. Films having a compressive stress is preferred, because adhesion to the copper layer would be better. Lastly, good electrical performance is also required, with leakage currents and breakdown voltage parameters comparable to those of nearby dielectric layers.

There is currently a need for methods to form diffusion barrier layers that would maintain integration requirements relating to stability, mechanical strength and line-to-line leakage. Improved materials and processing are required.

SUMMARY

Stability of an underlying dielectric diffusion barrier during deposition and ultraviolet (UV) processing of an overlying dielectric layer is critical for successful integration. UV-resistant diffusion barrier layers are formed by depositing the layer in a hydrogen-starved environment. Diffusion barrier layers can be made more resistant to UV radiation by thermal, plasma, or UV treatment during or after deposition. Lowering the modulus of the diffusion barrier layer can also improve the resistance to UV radiation.

The present invention is directed to a semiconductor processing method for forming layers of dielectric material. A UV-resistant dielectric diffusion barrier film is provided in a substrate. A dielectric film is deposited on the barrier film and treated with UV radiation that alters the properties of the dielectric film, but does not substantially alter the diffusion barrier film properties. A substantial alteration of the barrier film properties is one that would adversely impact the yield and quality of the IC device. A substantial alteration of the diffusion barrier film properties may affect the adhesion between the diffusion barrier layer and the copper or between the diffusion barrier and the overlying dielectric layer. In particular embodiments, the diffusion barrier film stress may not change by more than 20 MPa. In other embodiments, the diffusion barrier film stress may not change from compressive to tensile.

A UV-resistant diffusion barrier film may be composed of materials such as SiNC, SiBC, SiOC, SiBN, SiC, or SiN, for example, and be created by treating a deposited diffusion barrier film to render it substantially unsusceptible to alteration of its properties upon subsequent UV exposure. In one embodiment, a suitable treatment may be exposing the diffusion barrier film to UV radiation. The UV radiation exposure may occur in several operations after each deposition of a diffusion barrier material layer, until the desired film thickness is reached. In one embodiment, an alternating sequence of deposition-UV treatment-deposition-UV treatment may be used. Although the treatment's UV exposure will change the properties of the diffusion barrier film, this occurs prior to formation of overlying dielectric film so that subsequent UV treatment of overlying dielectric film will not alter substantially the film properties. Therefore, the UV treatment renders the diffusion barrier film unsusceptible to alteration of film properties upon subsequent UV exposure.

Another suitable treatment may be ion bombardment of the diffusion barrier film. A plasma with heavy ions may be used to bombard the diffusion barrier film so as to render the diffusion barrier film unsusceptible to alteration of film properties upon subsequent UV exposure through an overlying dielectric layer. A plasma treatment may occur during the diffusion barrier film deposition or after the film is deposited. During diffusion barrier film deposition, a biased pedestal is often used to direct ionized particles toward the substrate for deposition. By increasing the pedestal bias and using heavy ions in the plasma, the force of ion bombardment can be increased. This ion bombardment drives hydrogen out of the diffusion barrier film as it deposits. After the diffusion barrier film is deposited, it may be treated with plasma. A post-deposition plasma treatment may be accomplished with or without a biased pedestal. A diffusion barrier film with less hydrogen is less susceptible to alteration of film properties upon subsequent UV exposure.

Yet another suitable treatment is thermal annealing. The substrate may be heated to render the diffusion barrier film less susceptible to alteration of film properties upon subsequent UV exposure. Thermal annealing also drives hydrogen out of the diffusion barrier layer and is slower than UV or plasma treatment. Because the duration a wafer may be at high temperature (above 350° C.) is limited, thermal annealing works best in combination with one of the other treatment methods.

In another embodiment, the treatment method embodiments discussed above may be used in combination or in series. For example, a diffusion barrier film may experience plasma treatment as it is deposited, then UV radiation with thermal annealing, then more deposition with plasma treatment, followed by more UV radiation or plasma treatment. In another example, thermal anneal and deposition may occur at the same time, followed by plasma treatment and no UV radiation. The operations required to treat the diffusion barrier film depend on the final film properties desired and the tolerance for changes in film properties upon subsequent UV exposure.

In addition to treating the diffusion barrier film to render it unsusceptible to alteration of film properties upon subsequent UV exposure, a more UV-resistant diffusion barrier film may be deposited in the first place. Each of the treatment operations discussed above aims to reduce the amount of hydrogen in the diffusion barrier film. If the diffusion barrier film is deposited under a hydrogen-starved environment where less hydrogen would be in the film, that diffusion barrier film would be more UV resistant. A hydrogen-starved environment may be created by using a precursor gas that has little or no hydrogen. Such precursors may be silane, tetramethylsilane (4MS), trimethylsilane (3MS), HMDS, HMDZ, carbosilanes or ammonia.

It has also been found that a diffusion barrier film with lower modulus is less susceptible to alteration of film properties upon subsequent UV exposure. Because the magnitude of the stress shift is directly related to the effective Young's modulus, a film with lower modulus will be more UV-resistant in accordance with the present invention.

These and other features and advantages of the present invention will be described in more detail below with reference to the associated drawings.

DETAILED DESCRIPTION OF SPECIFIC EMBODIMENTS

Introduction and Overview

Figure 1A:
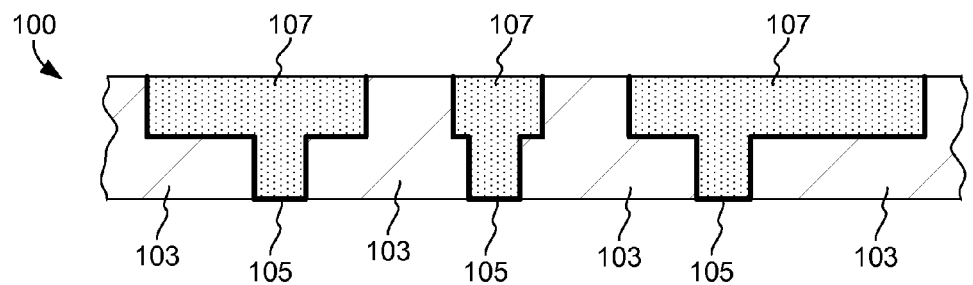
FIGS. 1A-1E show cross sectional depictions of device structures created during a copper dual damascene fabrication process in accordance with the present invention.

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

Stability of an underlying dielectric diffusion barrier during deposition and ultraviolet (UV) processing of an overlying dielectric layer is critical for successful integration. UV-resistant diffusion barrier layers are formed by depositing the layer in a hydrogen-starved environment. Diffusion barrier layers can be made more resistant to UV radiation by thermal, plasma, or UV treatment during or after deposition. Lowering the modulus of the diffusion barrier layer can also improve the resistance to UV radiation.

An overlying dielectric layer may be treated with UV radiation, for example for porogen removal and hardening of a porous PECVD ULK film. UV curing is used to drive out porogen from composite porogen-OSG films, leaving a porous OSG matrix with a low-k-value, generally between 2.0 and 2.6. The dielectric films are prepared from precursor films or layers that contain a structure former that serves as a backbone of a porous network, and a porogen, which generates the porous regions within the porous network. The methods involve a multiple operation UV cure process in which porogen is removed in an initial exposure (or exposures) to UV radiation to form a porous dielectric film. This operation tends to make the film softer. Once the porogen is removed, the film is exposed to UV radiation to increase cross-linking within the film, thereby increasing the hardness. Films produced by these methods have lower stress than films produced using a single cure operation, while having comparable hardness and modulus as those films. The UV exposure characteristics of these operations are different so as to accomplish different effects on the film.

The thickness of the precursor film (and hence the resulting dielectric layer) depends upon the ultimate application. For an interlayer dielectric or packaging application, the thickness may range from 100 angstroms up to about 2 to 3 microns. In some cases, extra thickness is required to provide some amount of sacrificial dielectric to accommodate a subsequent planarization operation. In some cases, the thickness of the overlying dielectric layer may be driven in part by the ability of the UV radiation to penetrate the film and remove the porogen. Therefore relatively thin layers may be required for some processes.

Another example of treating an overlying dielectric film with UV radiation is fluorosilicate glass (FSG). FSG film may be treated with UV radiation to improve stability. UV exposure removes the loosely bound fluorine and/or the silanol that is formed from the exposure of an unstable FSG film to moisture. The UV exposure may also remove other defects in the SiOF film, such as Si—H and dangling (unsatisfied) bonds. It is believed that UV exposure also results in crosslinking in the Si—O matrix, further enhancing the film's stability.

During UV treatment of the overlying dielectric film, the underlying dielectric diffusion barrier film is also exposed to UV radiation. Depending on the thickness and optical properties of the overlying dielectric film to be treated, differing amounts of UV radiation penetrates to and interacts with the dielectric diffusion barrier film below.

The UV radiation can interact strongly with the underlying dielectric diffusion barrier film. UV radiation is known to increase dielectric diffusion barrier film tensile stress. It is believed that UV radiation breaks Si—H and Si—OH bonds and allows the hydrogen and hydroxyl to diffuse out of the film. The presence of bonded hydrogen in the film has been recognized as the major source of compressive residual stress. The presence of hydrogen reduces the nominal spacing between the molecules and generates compressive stress. When the hydrogen is removed, the spacing between the molecules is increased and the film becomes more tensile. In such as case, as result of the UV radiation, the dielectric diffusion barrier film stress shifts.

A stress shift from compressive to tensile for the dielectric diffusion barrier films can lead to reliability issues. The dielectric diffusion barrier film is a part of a film stack: for example, in a damascene structure, copper interconnect layers in trenches and vias surrounded by another dielectric film below; and a porous ULK film on top. A stress shift may affect the adhesion between copper and the dielectric diffusion barrier layer or the other dielectric layer and the diffusion barrier layer. If the adhesion at either interface becomes weak, the diffusion barrier layer can delaminate from the rest of the film stack.

The Copper Damascene Process

Film stacks are created in damascene processing, which is a preferred method for forming interconnections on integrated circuits. It involves formation of inlaid metal lines in trenches and vias formed in a dielectric layer (inter-metal dielectric). In order to frame the context of this invention, a copper dual damascene process for forming a partially fabricated integrated circuit is described.

Presented in FIGS. 1A-1D, is a cross sectional depiction of device structures created on a semiconductor substrate at various stages of a dual damascene fabrication process. A cross sectional depiction of a completed structure created by the dual damascene process is shown in FIG. 1E. "Semiconductor substrate" as used in this application is not limited to the semiconductor portions of an IC device, but is broadly defined as a semiconductor-containing substrate, which includes IC structures (e.g., conductors and insulators) residing upon semiconductor material. Referring to FIG. 1A, an example of a typical partially fabricated IC structure, 100, used for dual damascene fabrication is illustrated. Structure 100 as illustrated in FIGS. 1A-1D is part of a semiconductor substrate, and, in some embodiments, may directly reside on a semiconductor layer containing active devices, such as transistors. It may directly reside on a metallization layer or other layers that incorporate conductive materials, e.g. layers containing memory capacitors.

A layer 103 illustrated in FIG. 1A is a layer of inter-metal dielectric, which may be silicon dioxide but is more typically a low-k dielectric material. In order to minimize the dielectric constant of the IMD stack, materials with a k value of less than about 3.5, preferably less than about 3.0 and often as low as about 2.5 are employed as inter layer dielectrics. These materials include but are not limited to fluorine or carbon doped silicon dioxide, organic-containing low-k materials and porous doped silicon dioxide materials known to those of skill in the art. Layer 103 is etched with line paths (trenches and vias) in which a metal diffusion barrier 105 is deposited followed by inlaying with copper conductive routes 107.

Because copper or other mobile conductive material provides the conductive paths of the semiconductor substrate, the underlying silicon devices and dielectric layers proximate to metal lines must be protected from metal ions (e.g., $Cu^{2+}$) that might otherwise diffuse or drift into the silicon or ILD and result in degradation of their properties. Several types of metal diffusion barriers are used in order to protect the dielectric layers of the IC device. These types may be divided into partially conductive metal-containing layers such as 105 and non-conductive barrier layers which will be described in further detail with reference to FIG. 1B. Suitable materials for partially conductive diffusion barrier 105 include materials, such as tantalum, tantalum nitride and other materials known to those of skill in the art. These are typically deposited onto a dielectric layer having vias and trenches by a PVD method. Typical metals for the conductive routes are aluminum and copper. More frequently, copper serves as the metal in damascene processes, as depicted in these figures. The resultant partially fabricated integrated circuit 100 is a representative substrate for subsequent damascene processing, as depicted in FIGS. 1B-1E.

Figure 1B:
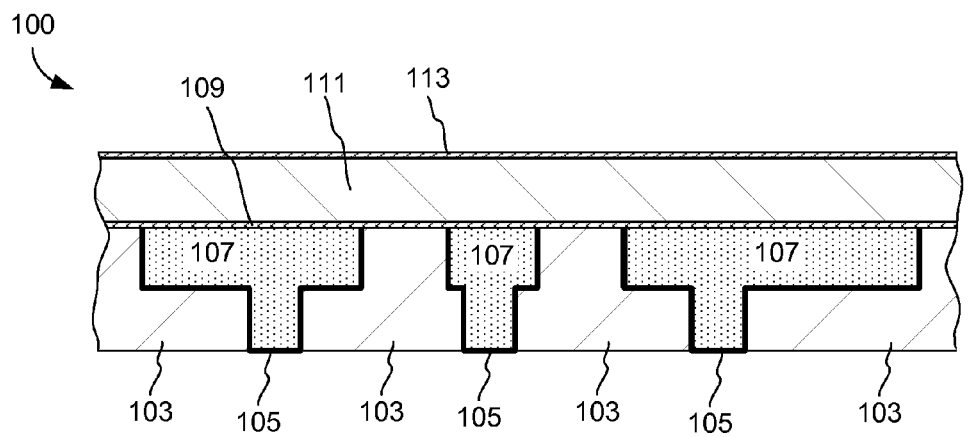

As depicted in FIG. 1B, a diffusion barrier 109 is deposited to encapsulate conductive routes 107. This layer may also serve as an etch stop during subsequent damascene processing. In contrast to partially conductive barrier 105, layer 109 should be non-conductive and should preferably have a low dielectric constant. Preferably materials with a dielectric constant of less than about 4.0, e.g., with a dielectric constant of 3.5-4.0 should be used. At the same time this layer should be mechanically strong and should be capable of protecting the underlying dielectric layer, which is often made of a soft and unstable material and it easily absorbs moisture. Layer 109 should also effectively prevent diffusion of metal into the dielectric layer and should provide etch selectivity when used as an etch stop. Layer 109 may be, for example, SiNC, SiBC, SiOC, SiBN, SiC, or SiN, or combinations thereof; and may be about 100-1500 angstroms thick. These materials can be deposited on a semiconductor substrate having exposed layers of dielectric and exposed metal lines by a number of methods, including plasma enhanced chemical vapor deposition (PECVD), chemical vapor deposition, such as thermal CVD or low pressure CVD (LPCVD) and spin-on methods. Of these methods, PECVD having a low frequency plasma component, provided by low frequency radio-frequency (LFRF) power source, is generally preferred.

The diffusion barrier layer 109 should adhere to the copper features and the dielectric layers above and below. A compressive barrier layer provides better adhesion between barrier and copper layers and is therefore preferred. Strong adhesion between the barrier and copper layers reduce the likelihood of copper diffusion and electromigration, both causes of subsequent device failure. The presence of bonded hydrogen in the film has been recognized as the major source of compressive residual stress. The presence of hydrogen reduces the nominal spacing between the molecules and generates compressive stress.

Referring again to FIG. 1B, a first dielectric layer, 111, of a dual damascene dielectric structure is deposited on a diffusion barrier 109. This dielectric layer 111 may be a porous ultra low-k (ULK) dielectric layer as discussed above, or a moderately low-k dielectric layer. A range of materials may be used as dielectric layer 111, from ULKs such as porous MSQ (methyl silsesquioxane) and CORAL, to moderately low-k films such as CDO (carbon doped oxide) and FSG, and finally to the conventional silicon dioxide. Two example dielectric materials, the porous ULK film and the FSG film, are discussed below to illustrate example UV radiation treatments.

Porous ULK Dielectric Film

Dielectric layer 111 may be an ultra low-k dielectric film formed with a structure former and a pore generator (porogen). In some methods, the structure former and porogen are co-deposited in one process. Any suitable deposition technique may be used, including spin-coating processes, print-on, dip coating, thermal process and chemical vapor deposition—particularly plasma enhanced chemical vapor deposition (PECVD). In alternative methods, the structure former and porogen are deposited separately in a two-phase process. For example, in some mesoporous films, a template-forming precursor, solvent and catalyst are mixed and applied by spin-coat or print-on methods to form a template in a first process phase, then a silica-forming precursor is introduced to the formed template in a second process step such as supercritical infusion into a polymer matrix. Depending on the application, the thickness of the film may range between about 15 nanometers and 3 micrometers.

The structure former serves as a backbone for the resulting porous low-k film Many different chemical compositions may be used as the structure former. In some embodiments, the composition includes silicon and oxygen. Sometimes it also includes carbon and/or other elements and even metals. Examples of precursors for structure formers include silanes, alkylsilanes (e.g., trimethylsilane and tetramethylsilane), alkoxysilanes (e.g., methyltriethoxysilane (MTEOS), methyltrimethoxysilane (MTMOS) diethoxymethylsilane (DEMS), methyldimethoxysilane (MDMOS), trimethylmethoxysilane (TMMOS) and dimethyldimethoxysilane (DMDMOS)), linear siloxanes and cyclic siloxanes (e.g. octamethylcyclotetrasiloxane (OMCTS) and tetramethylcyclotetrasiloxane (TMCTS)).

The porogen is any removable material that defines void regions in a dielectric matrix. Frequently, though not necessarily, the porogen is an organic material. In some cases the porogen is randomly distributed throughout the precursor film and other cases it is ordered in a repeating structure throughout the film. In the case of an ordered porous or mesoporous dielectric matrix, the porogen is frequently referred to as a "template." One type of ordered porogen, for example, is a block copolymer that has chemically distinct components (e.g. PEO polyethylene oxide and PPO polypropylene oxide) that segregate into separate phases. The discussion herein will refer to porogen and porogen materials in general and are intended to include any type of porogen, ordered or non-ordered, organic or inorganic, unless otherwise specified.

The porogen may be removed from the precursor film by a UV radiation treatment. In a first approach, the UV light directly interacts with the porogen to chemically decompose or otherwise modify the porogen and produce products that are more easily removed than the porogen itself. In another approach, the UV exposure occurs in the presence of oxygen to create an oxidizing environment (e.g., ozone and/or oxygen radicals) that oxidizes the porogen. The oxidation products are more easily removed than the porogen itself. Note that in this approach, some UV radiation may interact directly with the porogen as well. In general, the UV radiation is tuned for absorption by the porogen in the first approach and tuned for oxygen activation in the second approach. Thus, in the first approach, the UV radiation preferably has a high intensity component at a wavelength (or range of wavelengths) at or near an absorption peak of the porogen. Of course, the porogen may be chosen to match the characteristics of an available UV source.

After the porogen removal operation, the film is typically soft and compliant. The UV radiation treatment is continued to increases the hardness and/or modulus of the film. This cross-linking operation is so called because it is believed that it increases the number of crosslinks (i.e., the number of covalent bonds) within the dielectric film, thereby increasing the film hardness. However, the invention is not limited to a particular mechanism of increasing the hardness and modulus. Measures of film hardness and modulus presented herein may be made with any suitable apparatus including nanoindenter device.

UV intensity may be higher during cross-linking than during porogen removal. UV exposure time is largely a function of both the lamp intensity and the density of the precursor layer including porogen and structure former. UV exposure times range from seconds to tens of hours. Preferably, for commercial applications, the exposure time will be about 5 minutes or less. In a preferred embodiment, the exposure time ranges from about 1 second up to 5 minutes.

FSG Dielectric Film

Dielectric layer 111 may also be a fluorosilicate glass (FSG) dielectric layer. FSG can be deposited with conventional plasma enhanced CVD (PECVD) and high-density plasma CVD (HDP-CVD) processes that have been widely used for depositing undoped silicate glass (USG) in aluminum or tungsten/aluminum interconnects.

FSG film may be treated with UV radiation to improve stability. UV exposure removes the loosely bound fluorine and/or the silanol that is formed from the exposure of an unstable FSG film to moisture. Silanol is formed when water ($H_2O$) cleaves an Si—F bond in the SiOF film. The resulting Si—OH increases the dielectric constant of the film and the byproducts of the reaction, H, F, and/or HF cause adhesion issues within the device structure (blistering, delamination), especially when the device is heated in subsequent processes. The UV exposure may also remove other defects in the SiOF film, such as Si—H and dangling (unsatisfied) bonds. It is believed that UV exposure also results in cross-linking in the Si—O matrix, further enhancing the film's stability.

The UV exposure may be conducted in a partial pressure of a reactive gas that participates in the removal of loosely bound fluorine and Si—OH. An appropriate gas may be hydrogen. In the presence of a high intensity UV source, hydrogen assists in removing loosely bound or free fluorine by the reaction F+H→HF and in removing silanol by the reaction H+OH→$H_2O$ (these reactions assume that $H_2$+UV radiation→2H). At elevated temperatures above the ambient (e.g., up to 400 or 450° C.) and at reduced pressure less than one atmosphere the HF and $H_2O$ are evolved out of the film and pumped away.

Effect of UV Treatment on Underlying Diffusion Barrier Layer

Figure 2:
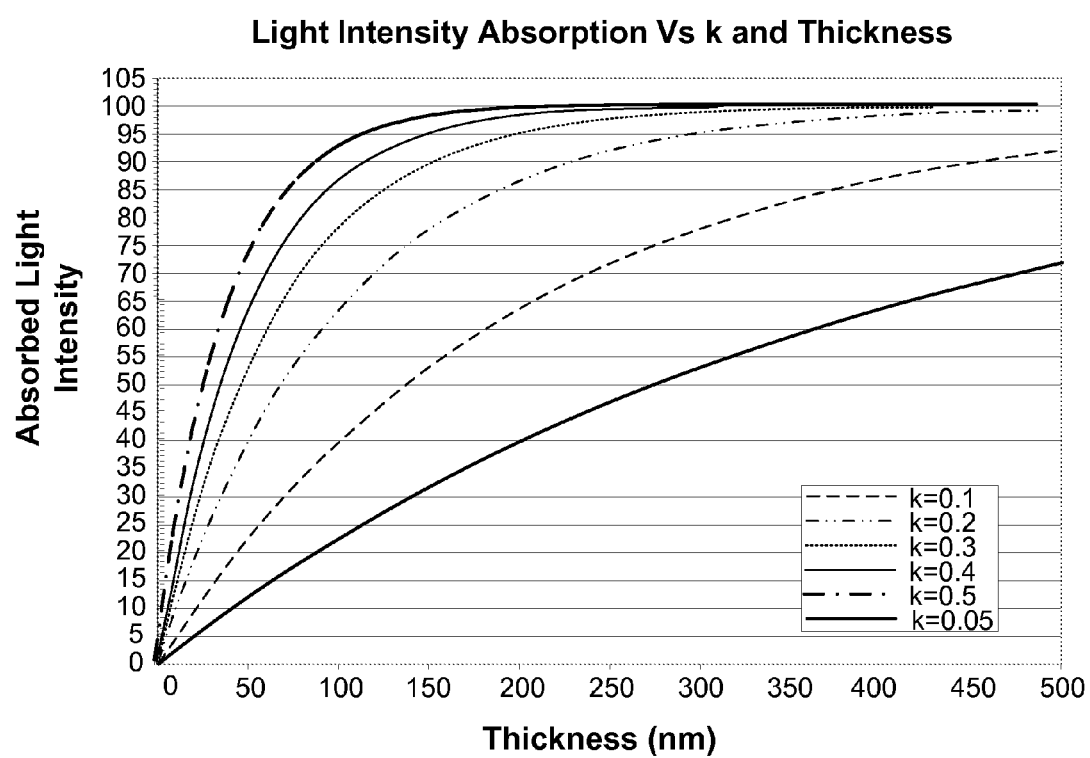
FIG. 2 illustrates the light absorption percentage at different thicknesses for films having different extinction coefficients.

As discussed above, dielectric layer 111 may be treated with UV radiation to effect certain desired changes in properties. During UV treatment of the overlying dielectric layer 111, the underlying dielectric diffusion barrier 109 is also exposed to UV radiation. Depending on the thickness and optical properties of the overlying dielectric film to be treated, differing amounts of UV radiation penetrate to and interact with the dielectric diffusion barrier film below. For the sample dielectric layers 111 discussed above, significant amounts of UV radiation would penetrate to the diffusion barrier layer. For example, at thickness of about 1000 angstroms to 2 microns, FSG is known to allow a large percentage of UV radiation to pass through. FIG. 2 illustrates the light absorption percentage at different thicknesses for films having different extinction coefficients. For a film with an extinction coefficient of 0.1 at about 1000 angstroms, only about 40% of the light is absorbed. The light transmitted, is therefore about 60%, less any light reflected.

The UV radiation interacts strongly with the underlying dielectric diffusion barrier film. UV radiation breaks Si—H and Si—OH bonds in the diffusion barrier film and allows the hydrogen and hydroxyl to diffuse out of the film. As the hydrogen and the hydroxyl in the silicon matrix are removed, the spacing between the molecules is increased. The increasing in molecule spacing causes the film to become more tensile. Thus, as result of the UV radiation, the dielectric diffusion barrier film stress shifts. The stress shift may be from more compressive to less compressive, but also may be from compressive to tensile.

The stress shifts from compressive to tensile for the dielectric diffusion barrier films can lead to reliability issues. The dielectric diffusion barrier film is a part of the film stack: copper interconnect layers in trenches and via surrounded by a dielectric film lays below; and another dielectric film, such as the porous ULK, lays on top. A stress shift may affect the adhesion between copper and the dielectric diffusion barrier layer on one side or the overlying dielectric layer and the diffusion barrier layer on the other side. A large stress shift can cause the diffusion barrier layer to delaminate from the rest of the film stack. A significant stress shift may cause the adhesion at either interface to become weak, and such weak interface may be a source of device failure after subsequent processing or during device operation. Weakness at the barrier-copper interface may allow copper diffusion and electromigration. The present invention is directed to reduce this stress shift so as to maintain the integrity of the film stack.

The Damascene Process Continues

After the dielectric layer 111 is deposited and treated, deposition of an etch stop layer 113 follows, using a PECVD, CVD (thermal or LPCVD) or a spin-on method. In this case the layer is deposited on a surface of dielectric 111 that does not include exposed metal lines. The dielectric layer 111 is typically composed of low-k dielectric materials such as those listed for a dielectric layer 103. Note that layers 111 and 103 need not necessarily have the same composition. Similarly, etch stop layer 113 is preferably a layer of low-k material but need not necessarily have the same composition as layer 109.

Figure 1C:
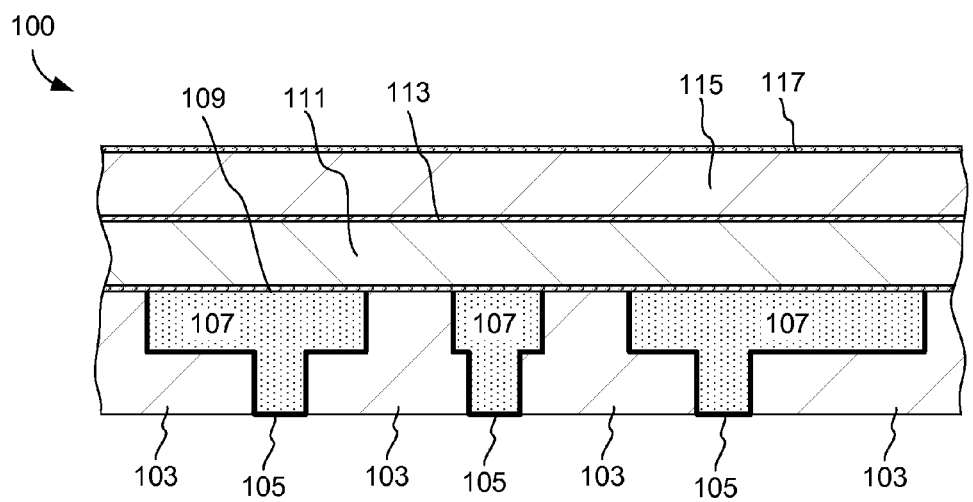

The process follows, as depicted in FIG. 1C, where a second dielectric layer 115 of the dual damascene dielectric structure is deposited in a similar manner to the first dielectric layer 111, onto etch-stop layer 113. Deposition of an antireflective layer (not shown) and a CMP stop layer 117 follows. Second dielectric layer 115 is typically a low-k dielectric material such as those described above for layers 103 and 111. A CMP stop layer 117 serves to protect the delicate dielectric material of IMD layer 115 during subsequent CMP operations. Typically, a CMP stop layer is subject to similar integration requirements as diffusion barrier and etch stop layers 109 and 113. While it is advantageous to utilize low-k materials for the barrier layers and hard masks (e.g., etch and CMP stop) layers of the IC structure, it should be realized that in certain embodiments, at least some of these layers may be composed of materials known in the art, such as silicon nitride, silicon carbide, oxygen doped silicon nitride (e.g., silicon oxynitride) and the like.

Figure 1D:
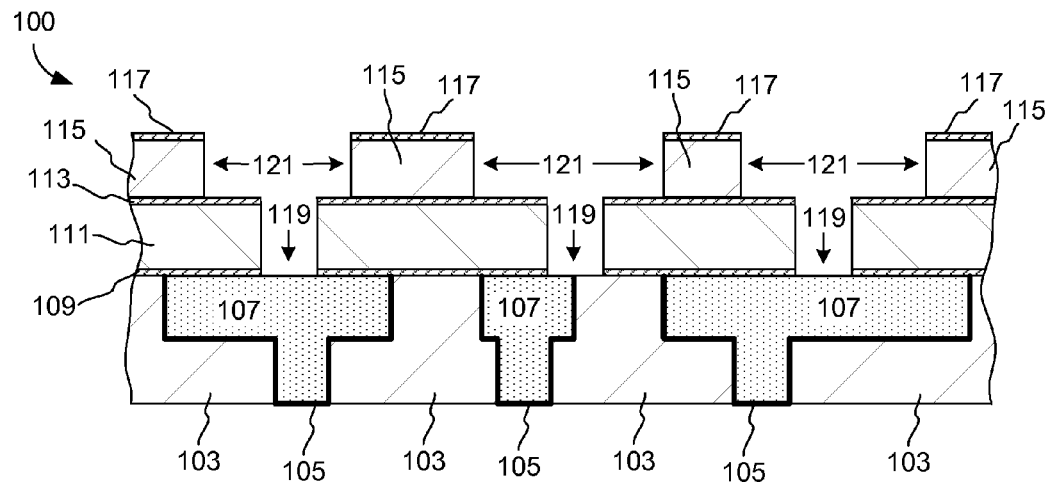
Figure 1E:
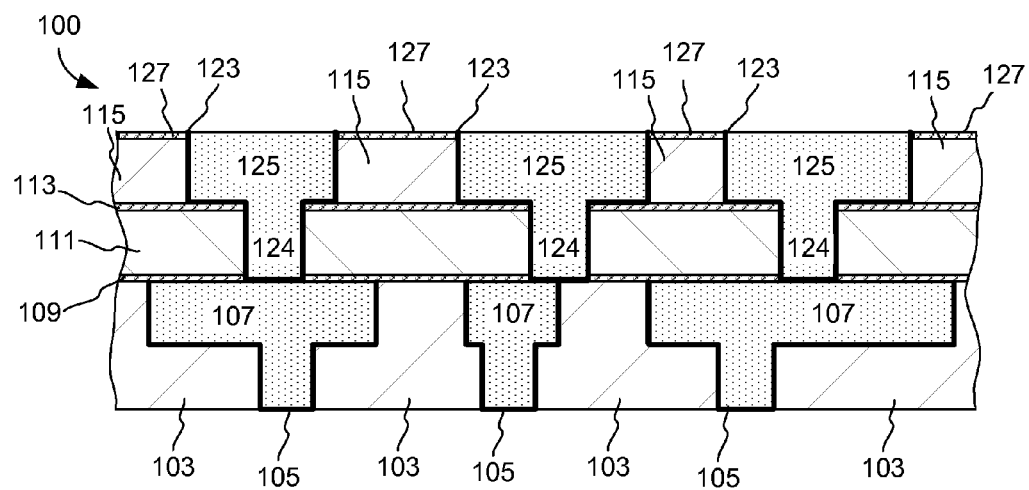

As depicted in FIGS. 1D-1E, next vias 119 and trenches 121 in the first and second dielectric layers are etched. Standard lithography techniques are used to etch a pattern illustrated in FIG. 1D. A trench-first or a via-first methods well known by those of skill in the art may be employed.

Next, as depicted in FIG. 1E, these newly formed vias and trenches are, as described above, coated with a metal diffusion barrier 123. As mentioned above, barrier 123 is made of tantalum, or other materials that effectively block diffusion of copper atoms into the dielectric layers.

After diffusion barrier 123 is deposited, a seed layer of copper is applied (typically by a PVD process) to enable subsequent electrofilling of the features with copper inlay. Excess metal deposited in the field is removed in a CMP operation, performed such that CMP stops at the CMP stop layer 117. FIG. 1E shows the completed dual damascene process, in which copper conductive routes 124 and 125 are inlayed (seed layer not depicted) into the via and trench surfaces over barrier 123.

Performance characteristics that are important for materials used in etch-stops, copper diffusion barriers and other similar layers, will be presently described.

Integration Requirements

Barrier and etch stop layers, such as layers 109, 113, and 117 shown in FIG. 1E should not only possess a low dielectric constant in order to minimize the effective dielectric constant of an IMD stack, but should preferably meet a number of integration requirements. These requirements relate to stability of these layers, their mechanical strength, their stress characteristics and their electrical performance.

The stability of the film may be assessed by measuring its properties immediately after the film has been deposited and after the deposited film has been exposed to ambient environment and subsequent semiconductor processing such as deposition and UV treatment of an overlying dielectric layer. The difference between these two values is a measure of stability of the film with respect to the measured parameter.

Stability of the film can be assessed with regard to stress parameters of the film. It is preferable that residual stress of the deposited film does not substantially change over time. Large stress shifts may be associated with cracking of the film or delamination of the film from the underlying substrate. Barrier films having stress shift of less than about 20 MPa are typically considered suitable for integration.

In addition to stress shift parameter, the absolute value of residual stress is an important integration characteristic. Residual stress is comprised of an extrinsic stress component and an intrinsic stress component. Further, residual stress can be either compressive or tensile. Compressive stress pushes the film out (along the plane of the film) and causes it to bend the underlying substrate so that it is convex. Tensile stress pushes the film inward causing the underlying substrate to adopt a concave shape. A film of excessive tensile stress tends to initiate cracking spontaneously or under external influence. Further, the tensile stress tends to propel the crack propagation in the film.

Compressive and tensile stresses are measured on one scale with positive values corresponding to tensile stress and negative values corresponding to compressive stress. On this scale, higher compressive stress is characterized by lower negative values, while higher tensile stress is characterized by higher positive values. Films having no residual stress correspond to zero on this scale. Conventional low-k ILD layers (k<3.2), typically have a tensile stress in excess of 50 MPa. While generally an etch stop or barrier layer is compressive, more compressive films are strongly preferred for these types of applications because more compressive barrier layer has better adhesion between barrier and copper layers. In addition, compressive stress also can offset tensile stress in an underlying layer. However, compressive stress decreases (becomes less compressive) with decreasing k. For example, conventionally prepared barrier materials with k of 3.5, are hard to reach compressive stress values lower than −100 MPa. This leads to increased possibility of cracking, especially in a multi-layer stack that has several highly tensile layers deposited on top of one another, and may ultimately lead to device failure. The low-k materials as described herein overcome this difficulty by affording films, which are highly or moderately compressive. Low-k ODC films with k value less than about 4.0 (e.g., 3.5-4.0) and compressive stress values that are lower than −100 MPa, and in some cases lower than about −150 MPa are herein provided. Note that stress was measured using a "Flexus" tool purchased from KLA-Tencor Corporation. Generally, any tool that accurately measures bow or other deviation from planarity in a wafer can be employed.

Stability of the film can be assessed with regard to the film hermeticity, or the ability to prevent moisture from penetrating into the film. When exposed to ambient environment containing atmospheric moisture, the barrier or etch stop film may absorb water contained in the air. Hygroscopic films that absorb large amounts of moisture are typically not suitable for use as barrier layers and etch stops in IC fabrication. Absorbed water may dramatically increase dielectric constant of the film to values that may not be acceptable for integration with low-k dielectric, even if the film has a low dielectric constant immediately upon deposition. Further, absorbed moisture will negatively affect the underlying dielectric layers and metal lines on which the film has been deposited, since it will increase the k value of low-k ILD and may contribute to oxidation of copper in the copper lines to copper oxide.

It is, therefore, desirable that materials used for layers, such as diffusion barriers and hard masks, do not absorb substantial amounts of moisture. Even when moisture uptake may be relatively unimportant (e.g., when IC fabrication is performed with strict exclusion of adventitious water), suitable films should maintain their properties for long periods of time during fabrication as well as during end use. Preferably, these films should have high stability in terms of their dielectric constants. For example, as provided in some embodiments described herein, materials having a dielectric constant shift (k shift) of less than about 0.15, preferably less than about 0.10 when measured after 96 hours under ambient conditions, meet this integration requirement. For example, films having a k shift value of less than 0.1 are considered to be stable.

Integration requirements that relate to mechanical strength of the film demand that an etch-stop or barrier material possesses high hardness and modulus values, but diffusion barrier film with lower modulus are less susceptible to alteration of film properties upon subsequent UV exposure. The modulus is a measure of the stiffness as the ratio, for small strains, of the rate of change of stress with strain. Because the magnitude of the stress shift is directly related to the effective Young's modulus, a film with lower modulus will be more UV-resistant.

The need for good mechanical strength (high modulus) must be balanced against the need to create a UV-resistant film. In the context of the present invention, a desirable modulus range is about 20 to 30 GPa. Desirable hardness values for the films described herein are at least about 4 GPa, preferably above 5 GPa.

The diffusion barrier layer must meet these integration requirements as formed and as after subsequent processing. By changing the way the diffusion barrier film is deposited, or by treating the diffusion barrier film before the overlying dielectric layer is deposited, the film may be rendered substantially unsusceptible to alteration of its properties upon subsequent UV exposure. In other words, a UV-resistant diffusion barrier layer may be created by changing the deposition process, by treating the film, or both.

Forming a UV-Resistant Diffusion Barrier Film

A UV-resistant diffusion barrier film may be deposited with some modification of the existing PECVD process. Other processes to deposit diffusion barriers films include a variety of CVD and spin-on methods. The film obtained using the other processes may be treated to decrease its susceptibility to alteration of its properties upon subsequent UV exposure.

Diffusion barrier film is formed in a PECVD chamber that has the capability to generate a plasma with a high frequency radio frequency source (HF RF), typically with a frequency of about 1 MHz-30 MHz, commonly at 13.56 MHz and 27 MHz. Optionally, a low frequency radio frequency source (LF RF) may be used to direct the plasma toward the substrate surface on the pedestal. LFRF is typically 100 kHz to 500 kHz, commonly at 400 kHz. The substrate is contacted with a process gas that contains the necessary precursors of a diffusion barrier film. The precursors may be one or many, and may be gaseous or be solids carried by carrier gases as aerosols or suspensions.

As discussed earlier, UV radiation breaks hydrogen and hydroxyl bonds in the diffusion barrier film. If the diffusion barrier film is deposited under a hydrogen-starved environment such that less hydrogen is in the film, that diffusion barrier film would be more UV resistant. This hydrogen-starved environment may be created by using precursors and carrier gases that include little or no hydrogen. Such precursors may be silane, tetramethylsilane (4MS), trimethylsilane (3MS), hexamethyldisilane (HMDS), hexamethyldisilazane (HMDZ), carbosilanes or ammonia. Such carrier gases may be oxygen, nitrogen, or argon.

A hydrogen-starved environment may be designed such that reactions that create hydrogen gas are favored over reactions where hydrogen in incorporated into the silicon lattice. Therefore, what little hydrogen there is will be consumed in the favorable reaction.

An example of diffusion barrier film formed under hydrogen-starved environment is SiNC. This diffusion barrier film is formed using $NH_3$ and 4MS as a precursor at a flow rate of 200-7000 sccm and $N_2$ as the inert carrier at a flow rate of 1000-5000 sccm. A plasma is generated using HFRF at 13.56 MHz and 0.5-0.9 W/cm$^2$. A higher $NH_3$ to 4MS ratio leads to SiC films with less Si—H bonds.

In one embodiment, diffusion barrier film may be bombarded with ions as it forms. During diffusion barrier film deposition, a biased pedestal (LFRF) is often used to direct ionized particles toward the substrate for deposition. By increasing the pedestal bias and using heavy ions in the plasma, the force of ion bombardment can be increased. The bias power may be 0.05-0.5 W/cm$^2$. This ion bombardment would drive the hydrogen out of the diffusion barrier film as it deposits. Thus, a diffusion barrier film containing less hydrogen may be formed. A diffusion barrier film with less hydrogen is less susceptible to alteration of film properties upon subsequent UV exposure.

Heavy ions such as ions of Ar, Kr, and Xe are preferred in this embodiment because of their weight. Employing LF RF power has the effect of increasing the length of time in a given oscillation during which ions are accelerated in a single direction (toward the substrate surface). Because the ions are exposed to a field in this direction for a longer period of time, they can accelerate to higher speeds and hence strike the substrate with greater momentum. When high molecular-weight ions are employed, the momentum is further increased due to the greater mass component of the ion.

Besides forming a diffusion barrier film that contains less hydrogen, already formed films may be treated to remove the hydrogen. Such a technique is useful also for diffusion barrier films deposited using non-PECVD methods, such as spin-on films.

Treating the Diffusion Barrier Film

Treating a deposited diffusion barrier film can render it substantially unsusceptible to alteration of its properties upon subsequent UV exposure. A treatment may be exposing the diffusion barrier film to UV radiation. UV radiation treatment of the diffusion barrier film does not prevent the diffusion barrier film stress from shifting. Stress shifting in absence of an overlying dielectric layer is less harmful to the integrity of the film stack, because only adhesion to the layer below, that of copper interconnect features in a dielectric layer may be affected.

The diffusion barrier film may be treated with UV radiation after the film is deposited. The UV radiation exposure may occur in several operations after each deposition of a diffusion barrier layer, until the desired film thickness is reached. In one embodiment, a sequence of deposition-UV treatment-deposition-UV treatment may be used. Although the treatment UV exposure will change the properties of the diffusion barrier film, subsequent UV treatment of overlying dielectric film will not alter substantially the film properties. Therefore, the UV treatment renders the diffusion barrier film unsusceptible to alteration of film properties upon subsequent UV exposure.

Another treatment may be ion bombardment of the diffusion barrier film. A plasma with heavy ions may be used to bombard the diffusion barrier film so as to render the diffusion barrier film unsusceptible to alteration of film properties upon subsequent UV exposure through an overlying dielectric layer. A plasma treatment may occur during the diffusion barrier film deposition, as discussed above, or after the film is deposited. A post-deposition plasma treatment may be accomplished with or without a biased pedestal. A diffusion barrier film with less hydrogen is less unsusceptible to alteration of film properties upon subsequent UV exposure.

Yet another treatment is thermal annealing. The substrate may be heated to render the diffusion barrier film unsusceptible to alteration of film properties upon subsequent UV exposure. Thermal annealing also drives hydrogen out of the diffusion barrier layer and is slower than UV or plasma treatment. Because the duration a wafer may be at high temperature (above 350° C.) is limited, thermal annealing works best in combination with one of the other treatment methods.

In other embodiments, the treatment methods discussed above may be used in combination or in series. For example, a diffusion barrier film may experience plasma treatment as it is deposited, then UV radiation with thermal annealing, then more deposition with plasma treatment, followed by more UV radiation or plasma treatment. In another example, thermal anneal and deposition may occur at the same time, followed by plasma treatment and no UV radiation. The operations required to treat the diffusion barrier film depend on the final film properties desired and the tolerance for changes in film properties upon subsequent UV exposure.

Figure 3:
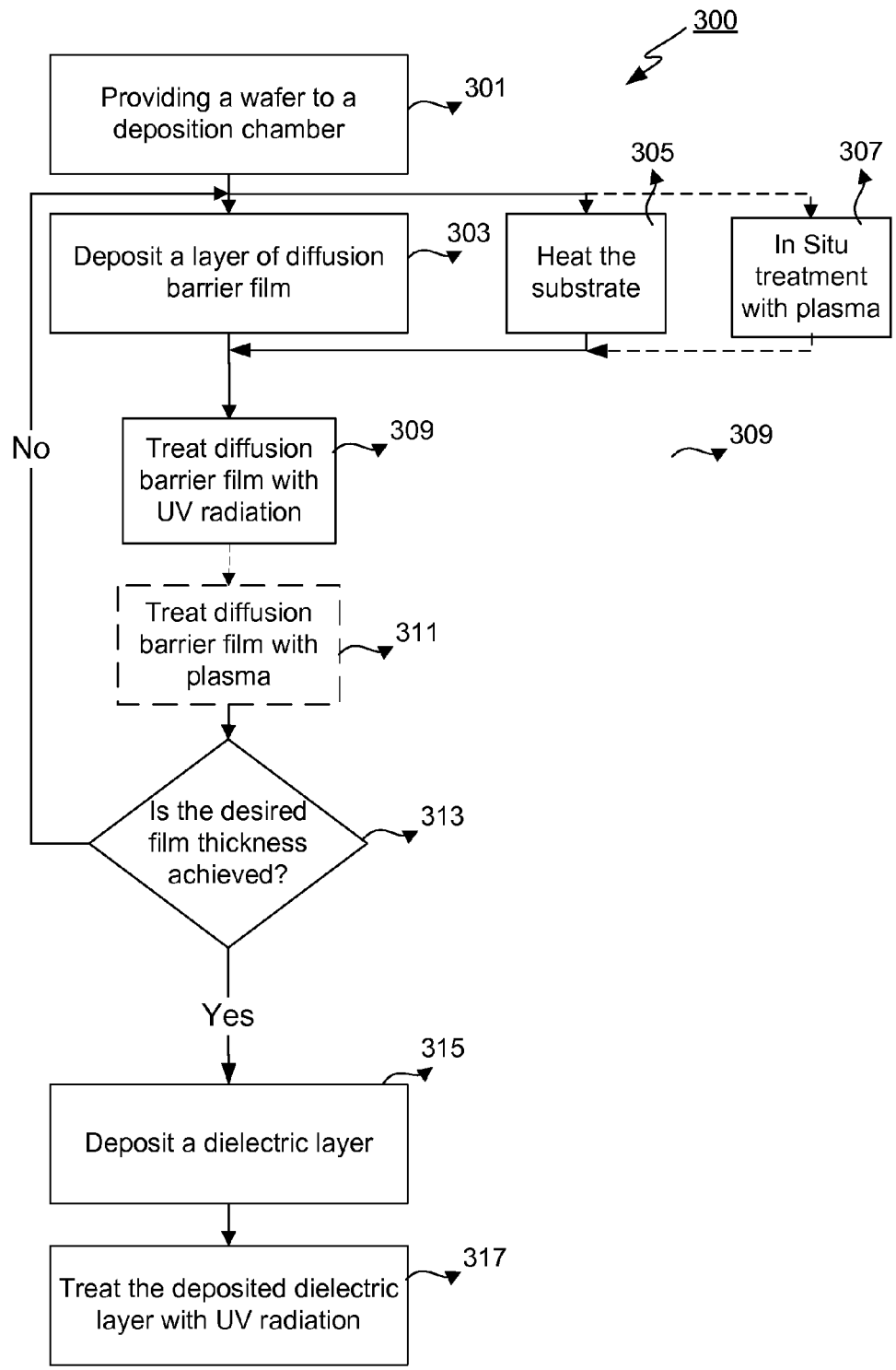
FIG. 3 shows a representative process flow diagram of one embodiment of the present invention.

FIG. 3 is a process flow diagram illustrating one embodiment of a treatment combination to create a UV-resistant diffusion barrier film. First, a wafer is provided to a deposition reactor 301. The wafer may include partially fabricated IC devices including one or more metal layers. A first layer of diffusion barrier film is deposited on the wafer 303. This diffusion barrier film may or may not be deposited under hydrogen-starved environment, as described above. At the same time as the deposition, the wafer is treated with heat 305. Diffusion barrier film usually occur with a heated pedestal. The wafer temperature may be as high as 425° C., usually at 100° C. to 400° C. Also at the same time, the pedestal bias power is increased to direct the ions toward the wafer surface 307, thereby treating the wafer surface with plasma to remove the hydrogen. For this plasma treatment during deposition, the LFRF power may be at 0.05-0.5 W/cm$^2$, preferably at 0.33/cm$^2$.

The diffusion barrier layer may be deposited in one or more layers. In some embodiments, several thin layers of diffusion barrier film are deposited, with treatment in between the layers and after the final layer. In other embodiments, one layer of diffusion barrier film is deposited, with treatment after the deposition. Treating one thin layer of diffusion barrier film at a time improves the uniformity of the film throughout the thickness. Treating a thicker layer of diffusion barrier film may result in the topmost part of the film having different properties than the bottommost part. For example, plasma treatment may not penetrate to make the film properties uniform throughout if the film is too thick.

UV Radiation Treatment

After the first layer is deposited, the film is further treated to decrease susceptibility to UV radiation altering the film properties. One such treatment is using UV radiation 309. UV radiation may be applied after each layer of diffusion barrier film, or after all the film has been deposited. In the embodiment of FIG. 2, the UV radiation is applied after each layer.

The UV radiation interacts strongly with the dielectric diffusion barrier film. UV radiation breaks Si—H and Si—OH bonds in the diffusion barrier film and allows the hydrogen and hydroxyl to diffuse out of the film. As discussed above, the film to become more tensile as a result. The film also becomes denser and harder as the UV radiation removes hydrogen and reduces the open structures in the silicon lattice.

A typical UV exposure in accordance with this aspect of the invention has a power density of less than 5 W/cm2, e.g., 1-3 W/cm$^2$ in either inert (e.g., He, Ar, forming gas, or N2) or oxidizing environments (e.g., in an anneal environment that comprises one or more of oxygen, ozone, peroxide or nitrous oxide), or reducing environments (NH3, H2, formic gas). The UV radiation has a spectral range of wavelengths from about 150-400 nm, and the exposure is conducted at ambient temperature for about 4000 seconds.

By controlling the UV power and exposure time, the amount of film stress shift may be controlled. As additional layers are added and treated with UV radiation, more stress shift may occur as the overlying diffusion barrier layers are treated. In general, however, each successive UV treatment should cause less and less stress shift as the film becomes less susceptible to the effects of the UV radiation.

The stress shift may be calculated such that the diffusion barrier film becomes less compressive, but not tensile. By depositing the film in a hydrogen-starved environment, less hydrogen is incorporated into the film. UV treatment of this film would create less stress shift. Thus, a compressive film may become less compressive, but not tensile.

On the other hand, if the film was not deposited in a hydrogen-starved environment, more hydrogen is incorporated in the film, creating a more compressive film. Removing the hydrogen from this film will cause a larger stress shift. This larger stress shift may cause the film stress to change from compressive to tensile. As discussed above, compressive diffusion barrier film is preferred because its adhesion to the copper features is better.

Plasma Post Treatment

As an alternative to UV radiation treatment or in series to a UV radiation treatment, the diffusion barrier film may be subjected to a plasma post deposition treatment 311, or ion bombardment. Just like UV radiation, plasma treatment removes hydrogen from the film and densifies the film. For example, for SiOC films, plasma treatment promotes cross-linking in the film by, for example, inducing methylene bridging between silicon atoms. Formation of Si—CH$_2$—Si bonds and similar moieties leads to a film having improved stability and mechanical strength. Plasma post treatment also decreases dielectric constant shifts. A smaller dielectric constant shift improves film stability. For example, for SiOC films, a dielectric constant shift value of was reduced by more than 0.06.

Plasma post treatment is performed by treating the film with inert gas ions, such as ions of Ar, Kr, and Xe formed in a plasma discharge. It is desirable to use inert gases having high molecular weight in order to maximize the effect of the ion bombardment.

Although plasma post treatment may be performed using a single frequency RF apparatus (i.e. no biased pedestal), it may be desirable to use a low frequency component at a relatively high level of power, e.g., at a power level of between about 0.1 and 2 W/cm². In a dual frequency apparatus the low frequency component of delivered RF power during post treatment may amount to between about 5 and 50 percent of the total power, and more preferably between about 5 and 30 percent of the total power. Employing LF RF power has the effect of increasing the length of time in a given oscillation during which ions are accelerated in a single direction (toward the wafer surface). Because the ions are exposed to a field in this direction for a longer period of time, they can accelerate to higher speeds and hence strike the substrate with greater momentum. When high molecular-weight ions are employed, the momentum is further increased due to the mass component of the ion.

Typically, plasma treatment for about 2-60 sec is sufficient to achieve the necessary amount of hydrogen removal to reduce the film susceptibility to alter film properties by subsequent UV radiation.

While inert gases with high molecular weight are required in some embodiments for the plasma post treatment step, it may be advantageous to include other gases, such as $N_2$, $CO_2$, He, and $H_2$ into the process gas in order to modulate the effect of argon, xenon or krypton plasma during plasma post treatment. In one example, $H_2$ gas is flowed at 4000 sccm with HFRF at 1.2 W/cm² to treat the wafer for 6 seconds. The example treatment has the effect of densifying the film and also remove Si—H bonds.

The process of depositing a diffusion barrier film and treating the film with either UV radiation or plasma or both may repeat until a desired thickness of the diffusion barrier film is achieved 313. Typical diffusion barrier film thickness is 50 to 1500 angstroms. After the desired thickness is achieved, then a dielectric layer is deposited on top of the diffusion barrier layer 315. This dielectric layer is typically a low-k film requiring subsequent UV treatment 317. Because the underlying diffusion barrier layer is already treated or formed with little or no hydrogen, the subsequent UV treatment of the overlying layer will not cause significant stress shift in the diffusion barrier layer.

Apparatus

The present invention can be implemented in many different types of apparatus, such as chemical vapor deposition (CVD) reactors and spin-coating systems. Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). In one embodiment, a wafer undergoing dielectric deposition is transferred from one station to another within the reactor during the process. While in process, each wafer is held in place by a pedestal, wafer chuck and/or other wafer holding apparatus. For certain operations in which the wafer is to be heated, the apparatus may include a heater such a heating plate. In a preferred embodiment of the invention, a PECVD (Plasma Enhanced Chemical Vapor Deposition) system may be used as well as, for example, an HDP CVD (High Density Plasma Chemical Vapor Deposition) system.

Figure 4:
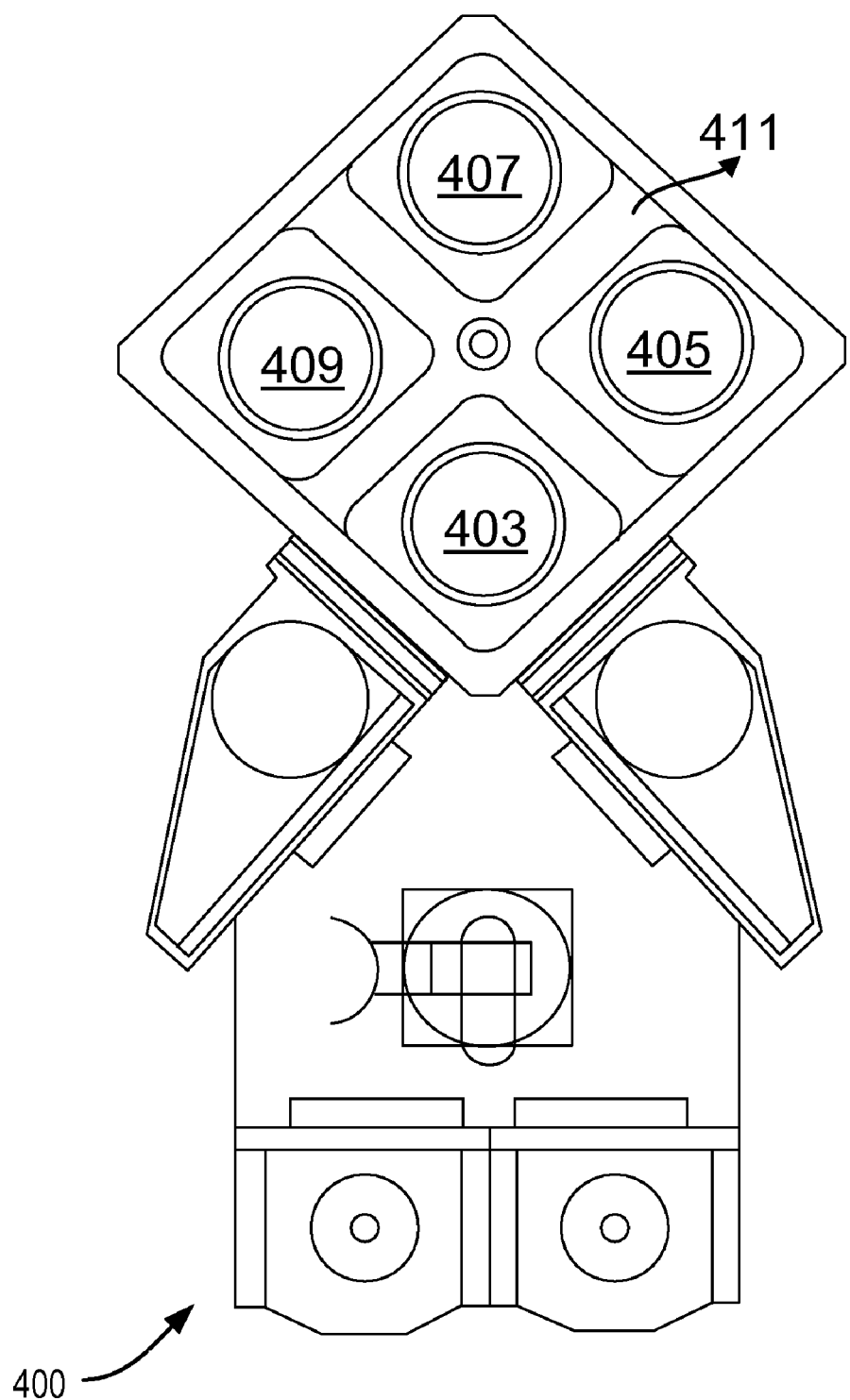
FIG. 4 presents a top view block diagram illustrating a multi-station apparatus suitable for practicing selected embodiments of the present invention.

In some embodiments a multi-station apparatus may be used for depositing and treating diffusion barrier films. The multi-station reactor allows one to run different processes concurrently in one chamber environment, thereby increasing the efficiency of wafer processing. An example of such an apparatus is depicted in FIG. 4. A schematic presentation of top view is shown. An apparatus chamber 401 comprises four stations 403-409. In general, any number of stations is possible within the single chamber of a multi-station apparatus. Station 403 is used for loading and unloading of the substrate wafers. Stations 403-409 may have the same or different functions. For example, some of the stations may be devoted to deposition step, while other stations may be used only for plasma post-treatment or only for UV treatment.

In one of the embodiments, stations 403 and 407 are deposition stations, and stations 405 and 409 are UV radiation or plasma post treatment stations. An indexing plate 411 is used to lift the substrates off the pedestals and to accurately position the substrates at the next processing station. After the wafer substrate is loaded at station 403, the first deposition occurs. The wafer is then moved to station 405 where the first deposited layer is treated. The substrate is further indexed to station 407, where another diffusion barrier layer is deposited. Additional treatment is performed when the substrate is moved to station 409. A number of layers may be required to complete the process; therefore, the wafer may make one or more pass through all the stations to complete the formation of the diffusion barrier layer.

The processed wafer is unloaded at station 403, and the module is charged with a new wafer. During normal operation, a separate substrate occupies each station and each time the process is repeated the substrates are moved to new stations. Thus, an apparatus having two deposition stations, 403 and 407, and two post-treatment stations 405 and 409, allows simultaneous processing of four wafers.

A suitable semiconductor processing tool may be the Novellus Vector™ tool having a 4-station deposition scheme may be used. In other embodiments, the Novellus Speed™ tool may be used. These tools are produced by Novellus Systems of San Jose, Calif. Although the discussion above described a multi-station reactor, note that the invention may be implemented on a multi-station tool or a single wafer chamber tool. In a single wafer chamber implementation, the wafer may be subjected to the methods of this invention in the same chamber, or different operations may be performed in different chambers.

It is understood that the examples and embodiments described herein are for illustrative purposes only and that various modifications or changes in light thereof will be suggested to persons skilled in the art. Although various details have been omitted for clarity's sake, various design alternatives may be implemented. Therefore, the present examples are to be considered as illustrative and not restrictive, and the invention is not to be limited to the details given herein, but may be modified within the scope of the appended claims. For example, while applications of UV-resistant diffusion barrier layers has been described, it is understood that the use of a UV-resistant layer is not limited to these applications, and may include use as inter-layer dielectric material or other use that may be found suitable by those of skill in the art.

What is claimed is:

1. A semiconductor processing method, comprising:
   providing a diffusion barrier comprising a single layer UV-resistant diffusion barrier film;
   depositing a dielectric film on the barrier; and treating the dielectric film with UV radiation in a UV processing station;

wherein the UV radiation alters the dielectric film properties, but does not substantially alter the diffusion barrier film properties.

2. The method of claim 1, wherein the UV treating operation alters film stress of the diffusion barrier film by 100-500 Mpa.

3. The method of claim 1, wherein the UV treating operation alters film stress of the diffusion barrier film by less than 300 Mpa.

4. The method of claim 1, wherein the diffusion barrier film stress after the UV treating operation remains compressive.

5. The method of claim 1, wherein, prior to deposition of the dielectric film, the UV-resistant diffusion barrier film is provided by pretreating a deposited diffusion barrier film to render it substantially unsusceptible to alteration of its properties upon subsequent UV exposure.

6. The method of claim 5, wherein the pretreatment comprises a UV or plasma exposure and optionally a thermal exposure.

7. The method of claim 6, wherein the UV radiation has a power density of about 1 mW-20 W/cm$^2$ and wavelength range from about 150-500 nm, and the exposure is conducted for less than 2 minutes.

8. The method of claim 1, wherein the UV-resistant diffusion barrier is provided by a method comprising:
depositing a layer of diffusion barrier film;
treating the layer of diffusion barrier film with UV radiation to provide the single layer diffusion barrier film; and
repeating the depositing and treating operations until a desired barrier thickness is reached.

9. The method of claim 8, wherein the UV radiation has a power density of about 1 mW-20 W/cm$^2$ and wavelength range from about 150-500 nm, and the exposure is conducted for less than 2 minutes.

10. The method of claim 1, wherein the UV-resistant diffusion barrier film is provided by a method comprising:
depositing the diffusion barrier film using precursor gas in a hydrogen-starved environment.

11. The method of claim 10, wherein the precursor gas is a member selected from the group consisting of silane, tetramethylsilane (4MS), trimethylsilane (3MS), HMDS, HMDZ, carbosilanes, ammonia, and a combination of these.

12. The method of claim 1, wherein the UV-resistant diffusion barrier is provided by a method comprising:
depositing a layer of diffusion barrier film;
treating the layer of diffusion barrier film with plasma; and
repeating the depositing and treating operations until a desired film thickness is reached.

13. The method of claim 12, wherein the plasma comprises ammonia, argon, krypton, xenon, or a combination of these.

14. The method of claim 12, wherein the depositing and treating operations occur at the same time.

15. The method of claim 12, further comprising:
treating the layer of diffusion barrier film with UV radiation.

16. The method of claim 1, wherein the UV-resistant diffusion barrier film is provided by a method comprising:
depositing a layer of diffusion barrier film;
treating the layer of diffusion barrier film with thermal annealing.

17. The method of claim 1, wherein the UV-resistant diffusion barrier film comprises SiNC, SiBC, SiOC, SiBN, SiC, or SiN.

18. The method of claim 1, wherein the UV-resistant diffusion barrier film is formed by reducing the modulus of a conventional diffusion barrier film.

19. The method of claim 18, wherein the UV-resistant diffusion barrier film has a modulus of less than 30 GPa.

20. The method of claim 1, wherein all steps occur in the same semiconductor tool.

21. A semiconductor processing method, comprising:
depositing a diffusion barrier film;
treating the diffusion barrier to render the diffusion barrier film UV-resistant;
after treating the diffusion barrier film, depositing a dielectric film on the diffusion barrier film; and
treating the dielectric film with UV radiation in a UV processing station;
wherein the UV radiation alters the dielectric film properties, but does not substantially alter the diffusion barrier film properties.

* * * * *